United States Patent [19]
Wilt et al.

[11] Patent Number: 5,737,122
[45] Date of Patent: Apr. 7, 1998

[54] ILLUMINATION SYSTEM FOR OCR OF INDICIA ON A SUBSTRATE

[75] Inventors: Donald R. Wilt, Lexington; Richard S. Sidell, Needham, both of Mass.

[73] Assignee: Electro Scientific Industries, Inc., Portland, Oreg.

[21] Appl. No.: 561,181

[22] Filed: Nov. 20, 1995

Related U.S. Application Data

[63] Continuation-in-part of Ser. No. 98,136, Jul. 26, 1993, Pat. No. 5,469,294, which is a continuation-in-part of Ser. No. 877,843, May 1, 1992, Pat. No. 5,231,536.

[51] Int. Cl.$^6$ .................................................. C02B 27/02
[52] U.S. Cl. ........................ 359/436; 359/385; 356/401; 250/237 R
[58] Field of Search ..................... 359/436, 438, 359/439, 440, 385, 390–393, 368, 372–373; 356/359, 360, 363, 356, 401, 237; 250/237 R, 237 G, 227.29, 227.3, 548, 559.3; 362/301–302, 304, 298, 341, 800, 241, 249; 385/133

[56] References Cited

U.S. PATENT DOCUMENTS

| | | |
|---|---|---|
| 3,920,311 | 11/1975 | Tsuda et al. . |
| 3,930,713 | 1/1976 | Stankewitz et al. . |
| 4,127,318 | 11/1978 | Determann et al. . |
| 4,232,937 | 11/1980 | Swaminathan et al. . |
| 4,329,014 | 5/1982 | Reinheimer et al. . |
| 4,337,442 | 6/1982 | Mauck . |
| 4,367,463 | 1/1983 | Suzuki et al. . |
| 4,412,330 | 10/1983 | Mauck et al. . |
| 4,418,467 | 12/1983 | Iwai . |
| 4,444,492 | 4/1984 | Lee ............................ 356/401 X |
| 4,483,005 | 11/1984 | Smart . |
| 4,558,926 | 12/1985 | Johnson . |
| 4,585,315 | 4/1986 | Sincerbox et al. . |
| 4,601,551 | 7/1986 | Pettingell et al. . |
| 4,636,080 | 1/1987 | Feldman . |
| 4,685,775 | 8/1987 | Goodman et al. . |
| 4,697,087 | 9/1987 | Wu . |
| 4,703,166 | 10/1987 | Bruning . |
| 4,704,027 | 11/1987 | Phillips . |

(List continued on next page.)

FOREIGN PATENT DOCUMENTS 61-80471  4/1986  Japan .

OTHER PUBLICATIONS

IBM Technical Disclosure Bulletin, vol. 27, No. 10B, Mar. 1985, New York, U.S., pp. 6225–6226, XP002025590 Anonymous: "Light Tunnel Illumination Apparatus".

Brochure entitled "Self–Illuminating Camera Systems (SICS)," of Stahl Research Laboratories, Inc., 3 Westchester Plaza, Elmsford, NY 10523, 2 pages (undated but believed to have been published by Jan. 1990).

Brochure entitled "HineSight® 1500 Wafer I.D. Reader," of Hine Design, 1901 Embarcadero Road #104 Palo Alto, CA 94303, 2 pages (undated).

Brochure entitled "IFS–1 Image Formation System" of ProofLine, Inc., P.O. Box 36053, San Jose, CA 95158, 4 pages (undated but believed to have been published by 1989–1990).

*Primary Examiner*—K. Hantis
*Attorney, Agent, or Firm*—Stoel Rives LLP

[57] ABSTRACT

An illumination system is provided having one or more light sources, opaque baffles, and mirrors for illuminating indicia on a substrate, such as a semiconductor wafer, for viewing by a camera aligned parallel with or at an angle to the substrate. The light sources include light emitting diodes (LEDs) for illuminating soft marks and broad spectrum incandescent lamps for illuminating hard marks. Dark field and light field illuminators are provided for enhanced reading of light indicia on a dark background and dark indicia on a light background, respectively. A light control unit allows for manual or automated control of light source selection and light intensity. Opposing mirrors extending along the optical paths of the light sources, reflect light emitted from the light sources into the camera field of view, thereby increasing the illumination efficiency and permitting the use of fewer light sources.

27 Claims, 9 Drawing Sheets

U.S. PATENT DOCUMENTS

| | | |
|---|---|---|
| 4,732,473 | 3/1988 | Bille et al. . |
| 4,745,289 | 5/1988 | Mashima . |
| 4,769,523 | 9/1988 | Tanimoto et al. . |
| 4,772,774 | 9/1988 | Lejeune et al. . |
| 4,782,751 | 11/1988 | Colapinto .......................... 356/401 X |
| 4,795,881 | 1/1989 | Lejeune et al. . |
| 4,871,257 | 10/1989 | Suzuki et al. . |
| 4,872,052 | 10/1989 | Liudzius et al. . |
| 4,881,802 | 11/1989 | Stankewitz . |
| 4,884,178 | 11/1989 | Roberts ................................ 362/800 X |
| 4,918,284 | 4/1990 | Weisz . |
| 4,930,901 | 6/1990 | Johnson et al. . |
| 4,939,376 | 7/1990 | Woodruff et al. . |
| 4,941,082 | 7/1990 | Pailthorp et al. . |
| 5,048,968 | 9/1991 | Suzuki . |
| 5,057,664 | 10/1991 | Johnson et al. . |
| 5,265,170 | 11/1993 | Hine et al. . |

ILLUMINATION SYSTEM FOR OCR OF INDICIA ON A SUBSTRATE

CROSS-REFERENCE TO RELATED APPLICATIONS

The instant invention is a continuation-in-part of U.S. patent application Ser. No. 08/098,136 filed Jul. 26, 1993 now U.S. Pat. No. 5,469,294, which is a continuation-in-part of U.S. patent application Ser. No. 07/877,843, filed May 1, 1992, now U.S. Pat. No. 5,231,536.

FIELD OF THE INVENTION

The instant invention is drawn to the field of optics and, more particularly, to an LED illumination system for optical character recognition of indicia on a substrate.

BACKGROUND OF THE INVENTION

Semiconductor wafers and other substrates may be provided with indicia that indicate, among other things, wafer number and manufacturer. The indicia may be, for example, ¾ to ⅝ inches in length and are typically constituted as a matrix of laser-etched pits.

The difficulties in providing machine reading of such laser-etched indicia on semiconductor wafers arise from the fact that the characters themselves are the same color as their wafer substrates and show little relief; from the fact that the wafer surface is polished, so that it reflects the light used to read the characters; and from the fact that the surface of the wafer may undergo several coating processes that cover the characters and reduce their size and relief.

The heretofore known optical character recognition (OCR) systems have utilized the small surface irregularities introduced by the indicia to reflect light to a camera. But because the dots are so smooth, they disperse light only through a small angle and, in some instances, extremely small angles. As a result, the source of the light must be at a very small angle from the line of sight and it must be relatively intense. This places the source in the camera's field of view and the result is, in many instances, that the camera is blinded. While prior art techniques that use beam splitters to direct light along the line of sight have been utilized, these techniques have not been robust enough to illuminate small characters with many overcoat layers. High intensity fiber optic light sources represent another prior art technique that, while providing very intense light which functions at greater angles and illuminates even the most difficult characters, is subject to the considerable disadvantages of being expensive and large, and generating unwanted heat and vibration.

SUMMARY OF THE INVENTION

Accordingly, it is the principal object of the present invention to provide a robust, but inexpensive, light emitting diode (LED) illumination system for optical character recognition of indicia on a substrate, even when the characters have been overcoated with one or more layers.

In accord therewith, and in one embodiment, a camera having a field of view that is angled at a first acute angle to a normal to the substrate is provided for reading the indicia thereon within its field of view. First and second arrays of light emitting diodes each defining optical paths that are respectively disposed to either side of a second acute angle to the normal to the substrate, where the second acute angle is the same in magnitude as the first acute angle but lies on the other side of the normal, are provided for illuminating the indicia on the substrate. First and second baffles respectively disposed along the optical paths of the first and second arrays of light emitting diodes are provided to occlude the respective light emitting diode arrays and thereby prevent them from being imaged within the field of view of the camera while allowing the indicia to be read by the camera in the light of the LED arrays.

In further accord therewith, and in another embodiment, a camera having a field of view that is oriented with its long axis in parallel relation with a normal to the substrate is provided for reading the indicia thereon within its field of view. An optical member optically confronting both the camera and the substrate is provided for deviating light incident thereto to and toward the camera. The optical member may be a plane mirror angled to confront both the camera and the substrate; a double plane mirror, a first mirror member of which is angled to confront the substrate and a second mirror member of which is angled to confront both the camera and the first mirror member; or a prism. First and second arrays of light emitting diodes defining optical paths that are respectively disposed to either side of an acute angle defined with respect to a normal to the substrate are provided for illuminating the indicia on the substrate. First and second baffles, respectively disposed along the optical paths of the first and second arrays of LEDs, are provided to occlude the respective LED arrays and thereby prevent them from being imaged within the field of view of the camera while allowing the indicia to be read by the camera in the light of the LED arrays.

In these embodiments, the LED arrays may include one lens, multiple lenses, or no lens. Additionally, a mask may be provided in the nearfield of the LED arrays to allow placing comparatively large and readily available LEDs closer to the substrate without imaging them within the camera's field of view, while reducing overall package size.

In still another embodiment, a camera having a field of view that is oriented with its longitudinal axis in perpendicular relation with a normal to the substrate is provided for reading the indicia thereon within its field of view. A plurality of optical elements is arranged so that one of the elements confronts first and second arrays of LEDs to direct light emanating therefrom between baffles arranged to occlude the lamp arrays from other optical elements and thenceforth to other elements, one of which confronts the camera, thereby allowing it to read the indicia by the lamp light.

In yet another embodiment, specially configured for reading both soft and hard mark scribes, a camera having a field of view that is oriented with its longitudinal axis in perpendicular relation with a normal to the substrate is provided for reading the indicia thereon within its field of view. A plurality of optical elements is arranged so that one of the elements confronts first and second arrays of LEDs to direct light emanating therefrom between baffles arranged to occlude the LED arrays from other optical elements and thenceforth to other elements, one of which confronts the camera, thereby allowing it to read the indicia by the LED light. Additionally, this embodiment includes two supplemental illumination modes for reading hard markings.

The first additional mode is dark field illumination and consists of an array of incandescent lamps mounted near the indicia on the substrate, but out of the camera's field of view.

The second mode is bright field illumination and consists of a diffuse, preferably white, reflector located in the camera's field of view that is illuminated by first and second arrays of incandescent lamps proximate thereto, but hidden from the camera's view. The reflector is mounted between the first and second arrays of LEDs and in front of the mask used for soft mark illumination. The lamp arrays are placed adjacent to the LED arrays in a manner to provide uniform illumination of the reflector. The reflector is limited in size to that just sufficient to provide a bright background for the scribe window. All other light is blocked from the wafer and the camera's view by lamp housings and the baffles utilized for soft mark illumination. Minimizing the size of the reflector and blocking all other light from the wafer maximizes the contrast between the polished wafer surface, which reflects a clear image of the bright reflector, and the scribe marks, which scatter the light and thus appear dark. If the reflector were larger than the scribe window or if stray light from the lamps were allowed to illuminate the wafer, then the image contrast would be diminished due to the additional light scattered from the scribes entering the camera and making them appear brighter.

The invention provides a multi-channel light control unit controlling four illumination sources responsive to operator input and control logic for selecting an appropriate source and intensity of illumination to provide enhanced viewing of a variety of scribes. The control unit can be either hard-wired or include user programmable software that can adjust the illumination sources in response to camera feedback.

In still another embodiment, the optical paths defined by the illumination sources are bounded on either side by planar mirrors. The planar mirrors reflect light from the illumination sources into the camera field of view that would otherwise fall outside the field of view. The mirrors allow the width of the light source to be reduced by utilizing light that would otherwise be lost. Thus, fewer LEDs or incandescent bulbs are required to illuminate the same field of view. This results in a significantly narrower light source and a reduction in the required number of LEDs and bulbs.

BRIEF DESCRIPTION OF THE DRAWINGS

These and other objects, features and advantages of the present invention will become apparent upon reference to the following detailed description of the preferred embodiments and to the drawings wherein.

DETAILED DESCRIPTION OF THE INVENTION

Figure 1:
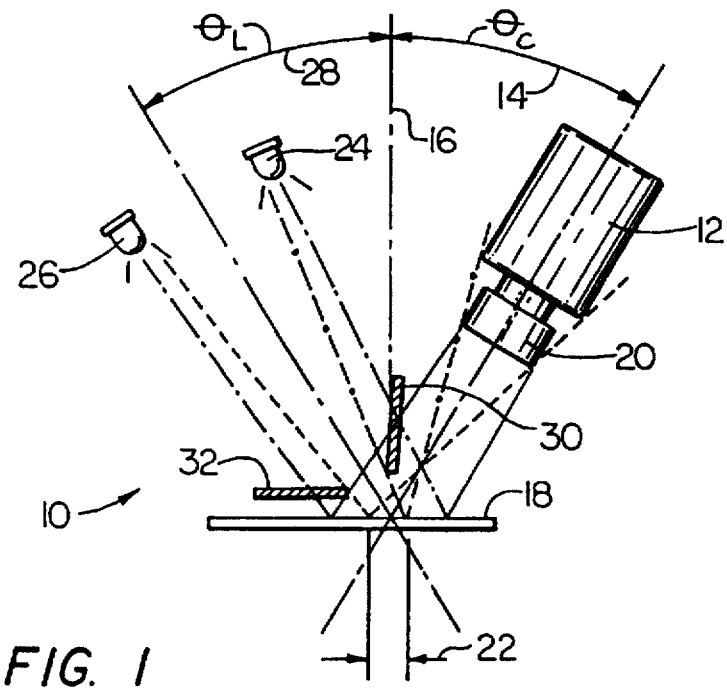
FIG. 1 is a partly pictorial, partly sectional diagram illustrating one embodiment of the robust LED illumination system for OCR of indicia on a substrate in accord with the present invention.

Referring now to FIG. 1, generally designated at 10 is a schematic diagram illustrating one embodiment of the robust LED illumination system for optical character recognition (OCR) of indicia (such as laser-etched character strings) on a substrate (such as semiconductor wafers). A camera 12 is provided at an acute angle marked "$\Theta_c$," and generally designated by arrow 14 that is defined with respect to a normal 16 to a semiconductor wafer 18. The camera 12 has a lens 20 that has a field of view that reads indicia, schematically illustrated by arrows 22, on the wafer 18.

First and second arrays of light emitting diodes, each of which are evenly distributed across the full width of the camera's field of view, are respectively disposed to either side of a second acute angle marked "$\Theta_L$," and generally designated by an arrow 28. The angle of the acute angle 28 is the same in magnitude as that of the angle of the acute angle 14, but the second acute angle is to the other side of the normal 16 to the substrate 18. Each of the LEDs of the LED arrays 24, 26 preferably are lensed, although unlensed LEDs together with separate cylindrical lenses may be provided as well. The number of LEDs is selected to provide robust illumination of the indicia 22 on the substrate 18. They are each arrayed in linear alignment to conform to the typically linear arrangement of the indicia 22. Other patterns are possible.

Each of the LED arrays 24, 26 provide optical paths along which their respective light beams illuminate the indicia on the substrate, one to either side thereof. Along the optical path of the array 24, an opaque baffle 30 is disposed; and along the optical path of the LED array 26, an opaque baffle 32 is disposed; the baffles 30, 32 are spacedapart a preselected distance. The baffle 30, which may be any opaque material such as aluminum, is oriented such that its normal is orthogonal to the normal 16 to the wafer 18, and the baffle 32 is oriented such that its normal is parallel to the normal 16 to the substrate 18, although other orientations thereof are possible so long as the direct images of the corresponding arrays are occluded by the corresponding baffle from being imaged off the specular surface of the substrate 18 and thereby picked up by the field of view of the lens 20 of the camera 12 while allowing the indicia 22 to be read therefrom in the light of the illumination provided by the LED arrays 24, 26.

Figure 2:
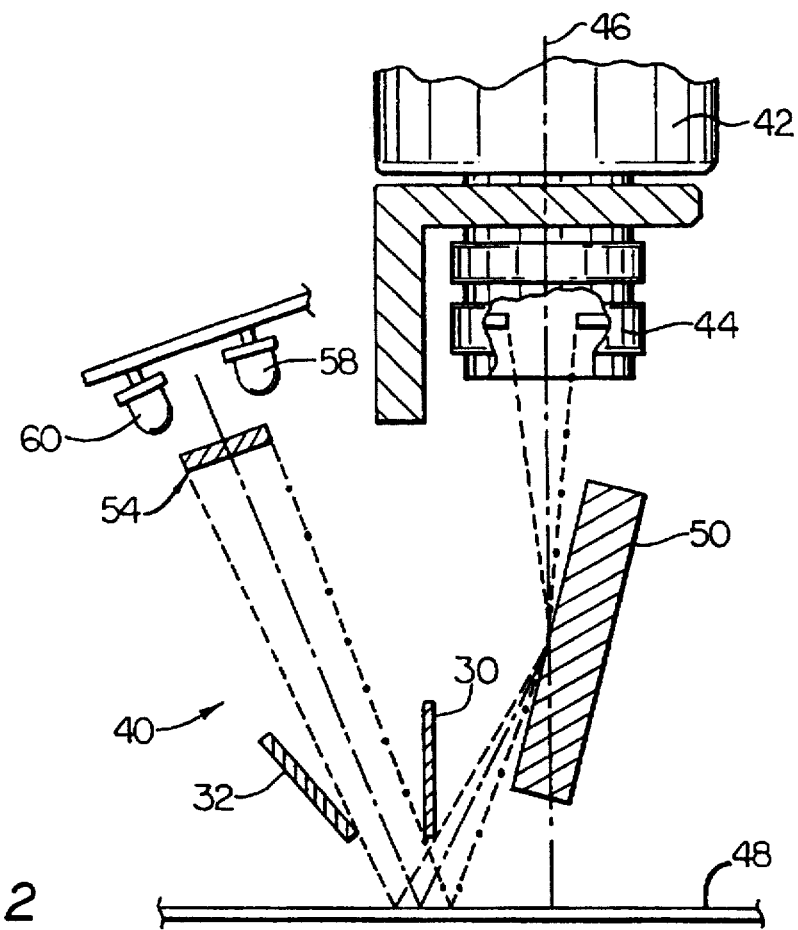
FIG. 2 is a partly pictorial, partly sectional diagram illustrating another embodiment of the robust LED illumination system for OCR of indicia on a substrate in accord with the present invention.

Referring now to FIG. 2, generally designated at 40 is another embodiment of the robust LED illumination system for optical character recognition of indicia on a substrate in accord with the present invention. The embodiment 40 of FIG. 2 differs from the embodiment 10 of FIG. 1 in two principal respects. The first respect is that the camera 42 having the lens 44 providing a field of view is mounted with the axis of the camera generally parallel to the normal 46 to the substrate 48, and an optical member 50, such as a planar mirror, is disposed within the field of view of the lens 44 of the camera 42 at a preselected acute angle. The angle at which the mirror is oriented within the field of view of the lens 44 is selected to deviate light reflected off the surface of the wafer 48 into the lens 44 of the camera 42, while allowing the camera 42 to be in the vertical position illustrated. The vertical orientation of the camera, among other advantages, enables a reduction in package size and simplifies mounting.

The second respect in which the embodiment 40 of FIG. 2 differs from that of the embodiment 10 of FIG. 1 is that a mask 54 having a rectangular shape is provided in the nearfield of the LED arrays 58, 60. The mask 54 allows placing large LEDs, which are readily commercially available, much closer to the substrate 48, typically a semiconductor wafer, without their being visible within the camera's field of view.

In this embodiment, the individual light emitting diodes of the light emitting diode arrays are preferably lensed, although cylindrical lenses may be added to unlensed LEDs to provide more uniform illumination along the optical paths of the LEDs of the arrays of LEDs.

Figure 3A:
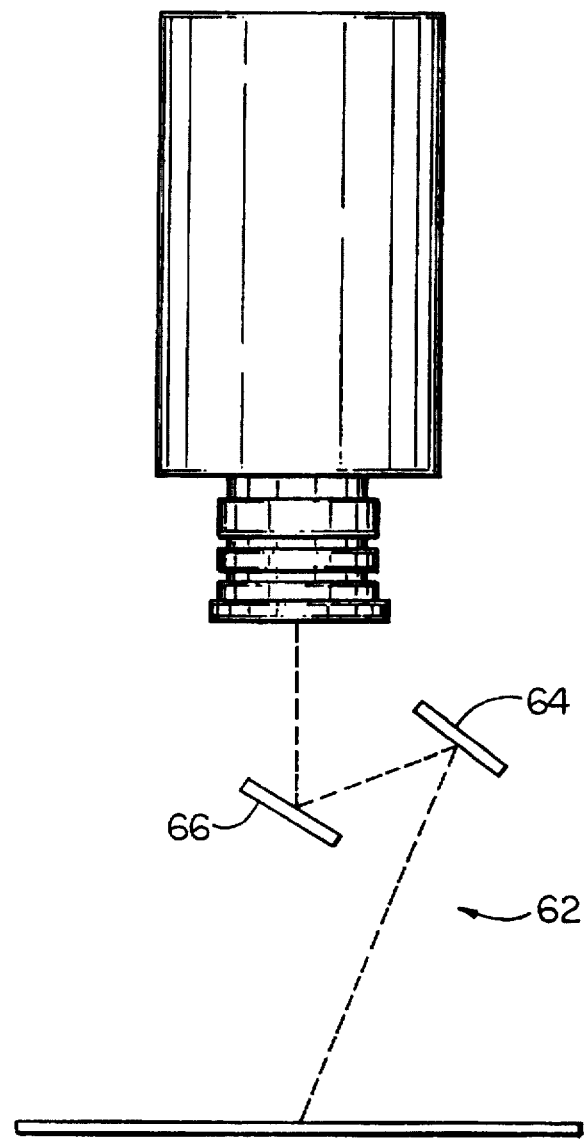
FIGS. 3A and 3B (collectively FIG. 3) are sectional diagrams illustrating alternative optical members useful in the FIG. 2 embodiment of the robust LED illuminator system for OCR of indicia on a substrate in accord with the present invention.

As seen in FIG. 3A, a double plane mirror generally designated 62 may be provided in place of the plane mirror 50 (FIG. 2) to deviate light reflected off the substrate to the camera. A first planar mirror member 64 thereof is angled to confront the substrate and a second planar mirror member 66 thereof is angled to confront both the mirror member 64 and the camera. The double reflections thereof present a true image of the indicia to be read.

Figure 3B:
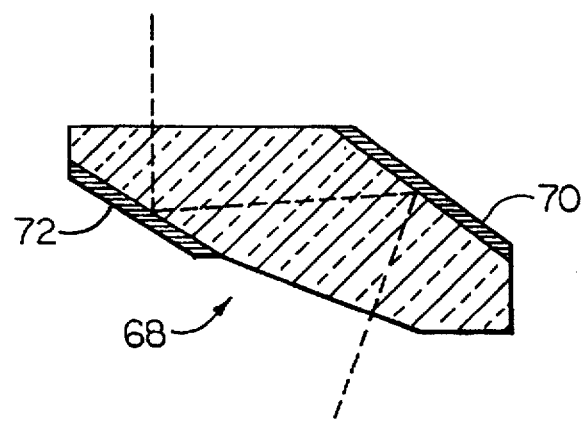

As seen in FIG. 3B, a prism generally designated 68 may be provided in place of the plane mirror 50 to deviate light reflected off the substrate to the camera. The prism 68 has silvered surfaces 70, 72 that function as the members 64, 66 (FIG. 3A) function to image the substrate within the field of view of the camera.

In addition to overcoming the difficulties in reading characters that are overcoated, an optical character recognition system can be faced with the challenge of reading characters that have been created by any of a variety of marking means that form marks having distinctive characteristics. One method of creating indicia on a substrate is with a laser. Depending on the laser technique, the marks produced thereby can be "soft" marks, characterized by shallow depressions in the wafer with smooth, curved edges, or "hard" marks, which are more crater-like with very sharp edges and a jagged rim at the wafer surface.

Figure 4:
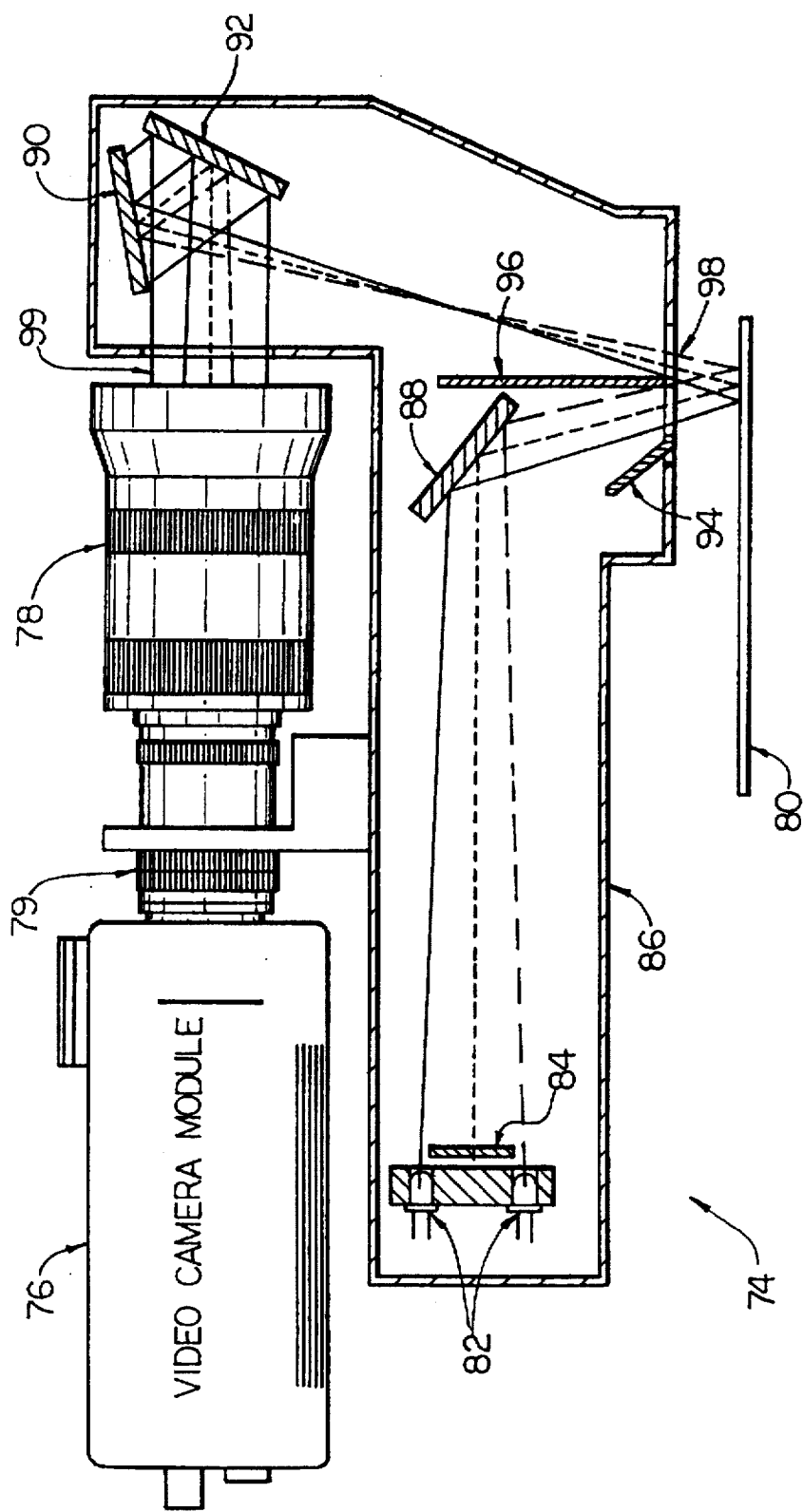
FIG. 4 is a partly pictorial, partly sectional diagram illustrating another embodiment of an illumination system for OCR of indicia on a substrate in accord with the present invention.

Referring to FIG. 4, generally designated at 74 is another embodiment of the illumination system. The embodiment 74 of FIG. 4 differs from the embodiment 40 of Fig. 2 in two respects. The first is that a camera 76 having lens 78 is mounted so that the axis of the camera 76 is generally perpendicular to the normal to a specular substrate 80. The second respect in which embodiment 74 of FIG. 4 differs from embodiment 40 of FIG. 2 is that a light source 82, such as an arrays of LEDs, is also positioned with its axis generally perpendicular to the normal to the substrate 80. The horizontal placement of the camera 76 and light source 82 advantageously minimizes the overall height of the package, while providing convenient access to the camera 76 and lens 78 during installation and adjustment operations.

The light source 82 is provided with a rectangular mask 84 in the nearfield of the light source, as described with respect to the embodiment of FIG. 2. The mask 84 and light source 82 are located within an enclosure 86 that also houses a first mirror 88, a second mirror 90, a third mirror 92, a first baffle 94, and a second baffle 96. The second and third mirrors, 90 and 92 respectively, can be replaced with a prism as illustrated in FIG. 3B. The enclosure 86 further includes a first opening 98, or scribe window, alignable with the marks to be read on the substrate 80, a second opening 99 with which the camera 76 is aligned to receive light reflected from the substrate 80, and mirrors 88, 90, and 92. The camera 76 is affixed to the enclosure 86 with an adjustable mounting bracket for refining the alignment of the camera 76 and lens 78 with the second opening 99.

The first planar mirror 88 is angled to confront the light source 82 and the substrate 80 so that the light striking the substrate 80 does not do so perpendicularly but at an angle. The first and second baffles, 94 and 96 respectively, are provided to control passage of light from the first mirror 88 to the substrate 80 for illuminating the substrate and the marks thereon. Light reflected from the substrate 80 at a complimentary aspect angle to that received from the first mirror 88 passes on the side of the second baffle 96 opposite the light source 82 to the second planar mirror 90 confronting the substrate 80. The second planar mirror 90 confronting the third planar mirror 92 reflects the light received from the substrate 80 to the third mirror 92, which is angled to confront the camera lens 78. Light reflecting from the third mirror 92, passes through the second opening 99 in the enclosure 86 and thus through the lens 78 and into the camera 76.

The size of the field of view is a function of the optical magnification of a selected lens 78, the physical size of the optical elements, and the size of an optional extension tube 79. In one embodiment, an extension tube 35 millimeters long is used for a 75-millimeter lens and a 10-millimeter extension tube is used with a 50-millimeter lens. For example, a field of view approximately 1.30 inches wide is provided for a 50 millimeter lens 78 having a nominal magnification of 0.25, and a camera 76 with a 6.6×8.8 millimeter charge-coupled device (CCD). If, however, the illustrated system 74 is configured with a 75-millimeter lens 78 operating at 0.50 magnification, the size of the field of view is reduced to 0.65 inches. A field of view this size is appropriate for viewing small (0.8 millimeter tall) scribes. Modification of the extension tube 79 and camera mounting position allow small adjustments (approximately ± 10%) to be made to the magnification. Cameras with different size CCDs, lenses of different focal lengths, and extension tubes of different lengths may be employed to obtain other magnifications. Those familiar with cameras and lenses can select the combination to provide the magnification best suited for a particular application.

Figure 5:
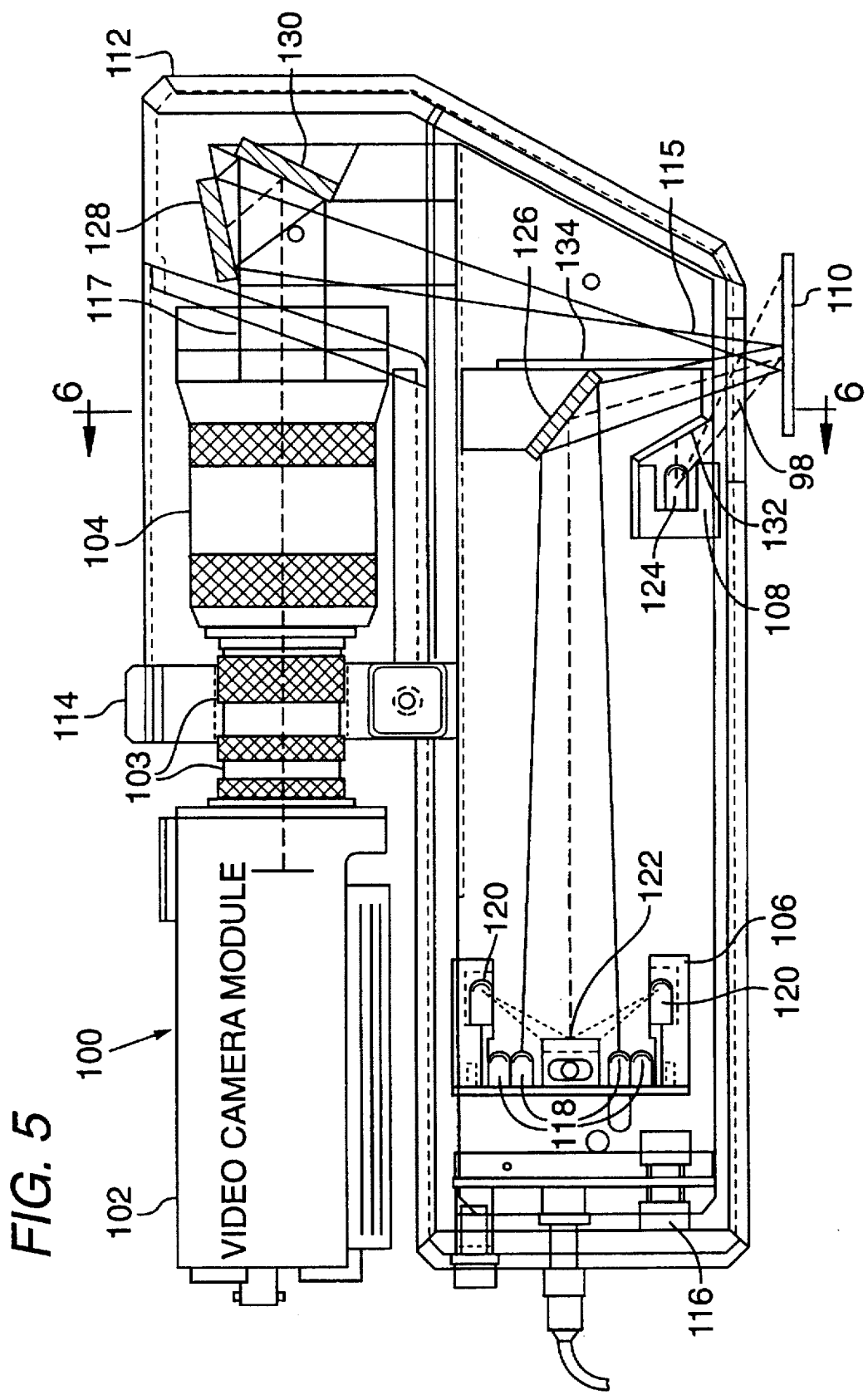
FIG. 5 is a partly pictorial, partly sectional diagram illustrating yet another embodiment of the illumination system for OCR of indicia on a substrate.

Referring now to FIG. 5, another embodiment of an optical character recognition system 100 having a camera 102 with a 75-millimeter lens 104, an extension tube 103, a first light system 106, and a second light system 108 aligned parallel to a marked substrate 110 is illustrated. This embodiment includes LEDs for reading "soft" marks and broad spectrum incandescent lamps for reading "hard" marks. An enclosure 112 having a mounting bracket 114 for the camera 102 is provided for housing the light systems and a four-channel light control unit 116 for controlling them.

Figure 6:
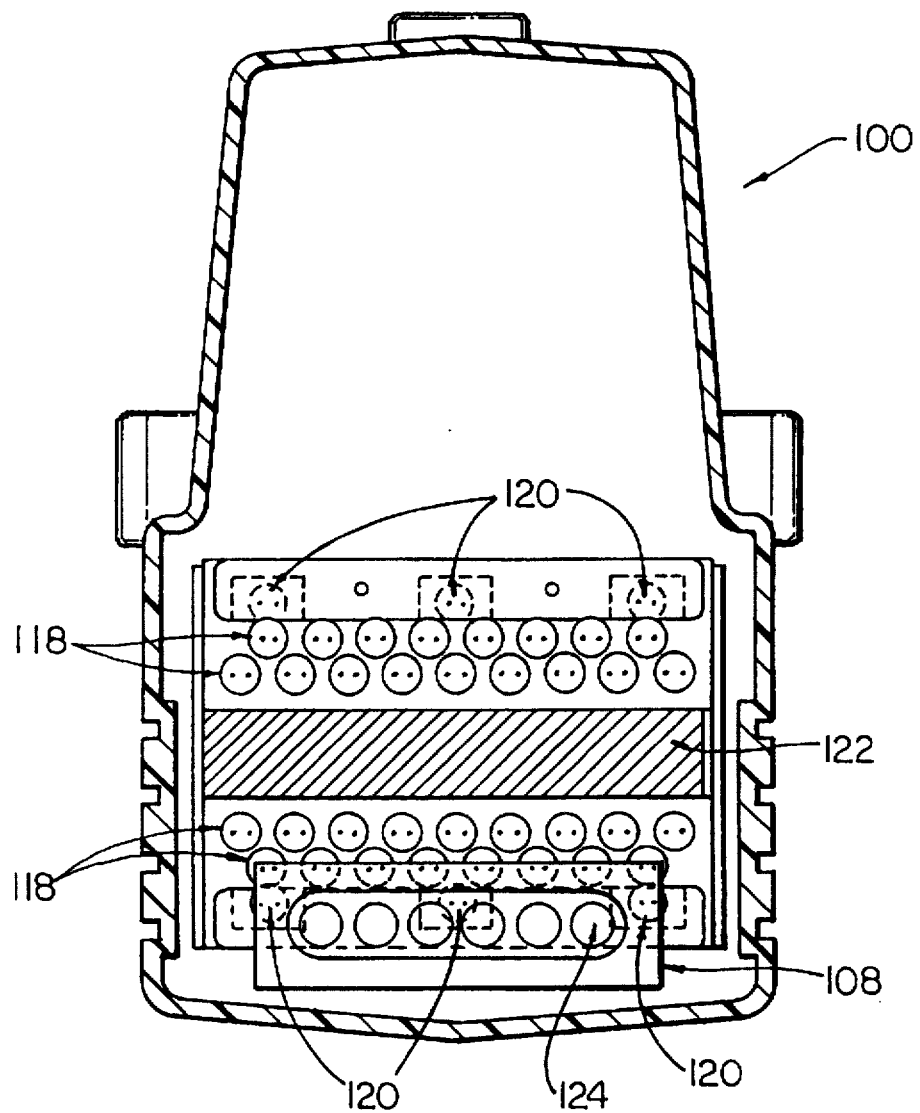
FIG. 6 is a sectional view of the illumination system of FIG. 5, taken along line 6—6.

FIG. 6 is a cross-sectional view of the illumination system of FIG. 5, which should be referred to in conjunction with FIG. 5 with regard to the following description. In the illustrated embodiment, the first light system 106 includes four rows of LEDs 118, wherein two rows are above the field of view of the camera 102 and two rows are below its field of view. The centermost or innermost two rows comprise a first array of LEDs 118 that are controlled by a first channel of the light control unit 116. The LEDs 118 of the outermost two rows comprise a second array of LEDs 118 that are independently controllable from the first array by a second channel of the light control unit 116. In the illustrated embodiment, each of the innermost rows includes nine LEDs 118 and each of the outermost rows includes eight LEDs 118.

The first light system 106 also provides for enhanced illumination of dark characters or scribes on a lightly colored background, known as bright field illumination. The bright field illumination components include two arrays of incandescent bright field lamps 120, responsive to a third channel of the light control unit 116, mounted near the LEDs 118 in light reflective housings. The bright field lamps 120 illuminate a highly reflective, lightly colored target 122, typically white, that is in the camera's field of view via the mirror arrangement.

The second light system 108 includes an array of incandescent 11 lamps 124 for illuminating brightly colored characters on a dark (black) background, known as dark field illumination. In the illustrated embodiment, there are six dark field lamps 124, responsive to a fourth channel of the light control unit 116, located in a light reflective housing. These lamps illuminate the substrate 110 and are not within the camera's field of view.

The incandescent dark field and light field lamps are standard, miniature, clear, white-light bulbs that are preferably operated at reduced voltage to extend their life, which is on the order of 20,000 or more hours. For the present application, incandescent lamps provide advantages over LEDs because they emit a broader spectrum of wavelengths, ranging from the visible well into the infrared spectrum, and are much less sensitive to interference effects that result from the thin coatings found on substrates 110 such as processed wafers. The incandescent bulbs also produce less heat than a fluorescent lamp (fluorescent lamps have "heaters" to produce the electrons necessary for the plasma discharge) and have the advantage of being easy to control in addition to their small size. Furthermore, the incandescent bulbs have electrical power requirements similar to LEDs 118 that are used for illuminating soft markings, so they are controlled by the same electronics and software.

Otherwise, the mirror and baffle arrangement, including a first mirror 126, a second mirror 128, a third mirror 130, a first baffle 132, and a second baffle 134 are the same as with respect to FIG. 4. An optical path 115 is shown from the substrate 110 to the second mirror 128.

In each of the embodiments, the light control unit 116 controls the illumination of the substrate for optimal character resolution under a variety of viewing conditions presented by particular scribes. In one embodiment of the system 100, the light control unit 116 receives feedback from the camera 102 to automatically adjust the source and intensity of light with software-controlled switching.

Figure 7:
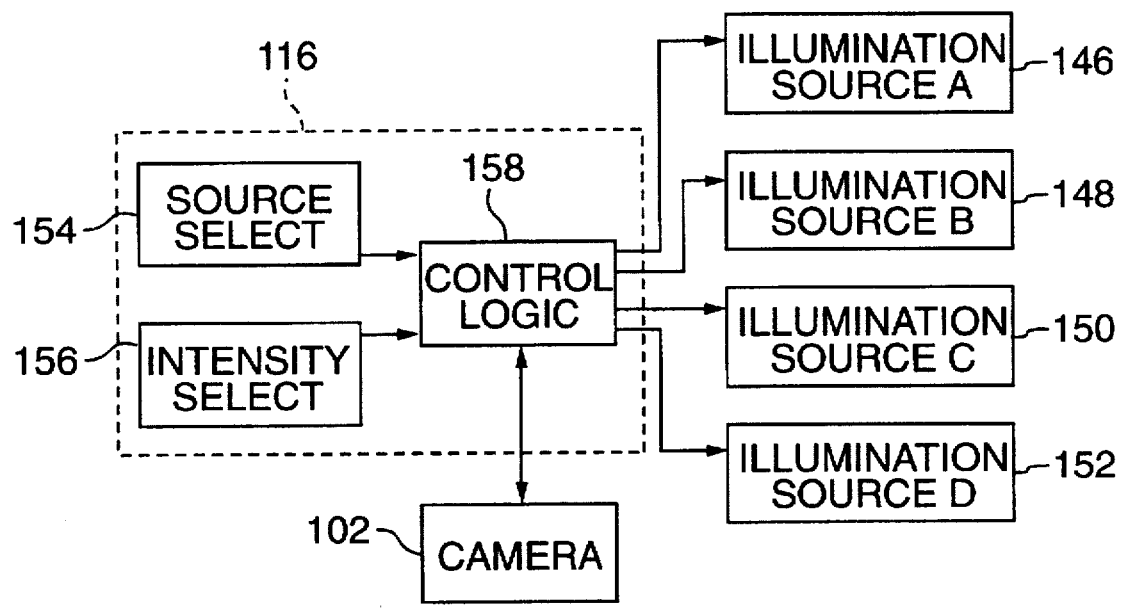
FIG. 7 is a schematic of an illumination system of the invention.

An exemplary light control unit 126 for the system 124 of FIG. 5 is illustrated schematically in FIG. 7, for control of four illumination sources A, B, C, and D, labeled 146, 148, 150, and 152 respectively, to correspond to inner rows of LEDs 118, the outer rows of LEDs 118, bright field lamps 120, and dark field lamps 124. A system operator selects a source and intensity of light using source select and intensity select controls 154 and 156, respectively. Control logic 158 is either in the form of hard wiring or software that allows a user to define both the light type and intensity by selecting appropriate commands. Accordingly, the system requires virtually no mechanical adjustment beyond initial set up for reading a wide variety of marks.

Figure 8:
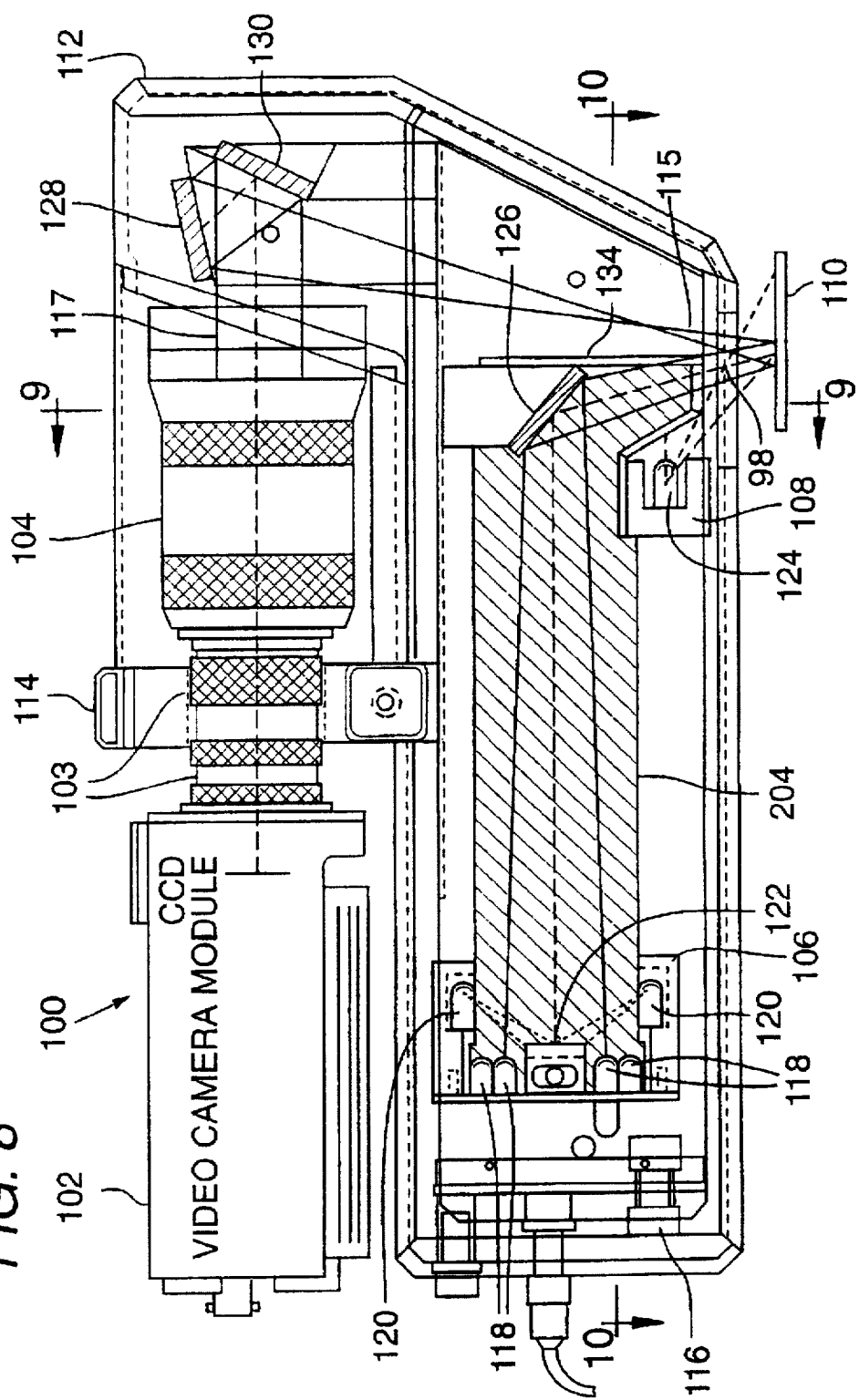
FIG. 8 is a partly pictorial, partly sectional diagram illustrating another embodiment of the illumination system of FIG. 5.
Figure 9:
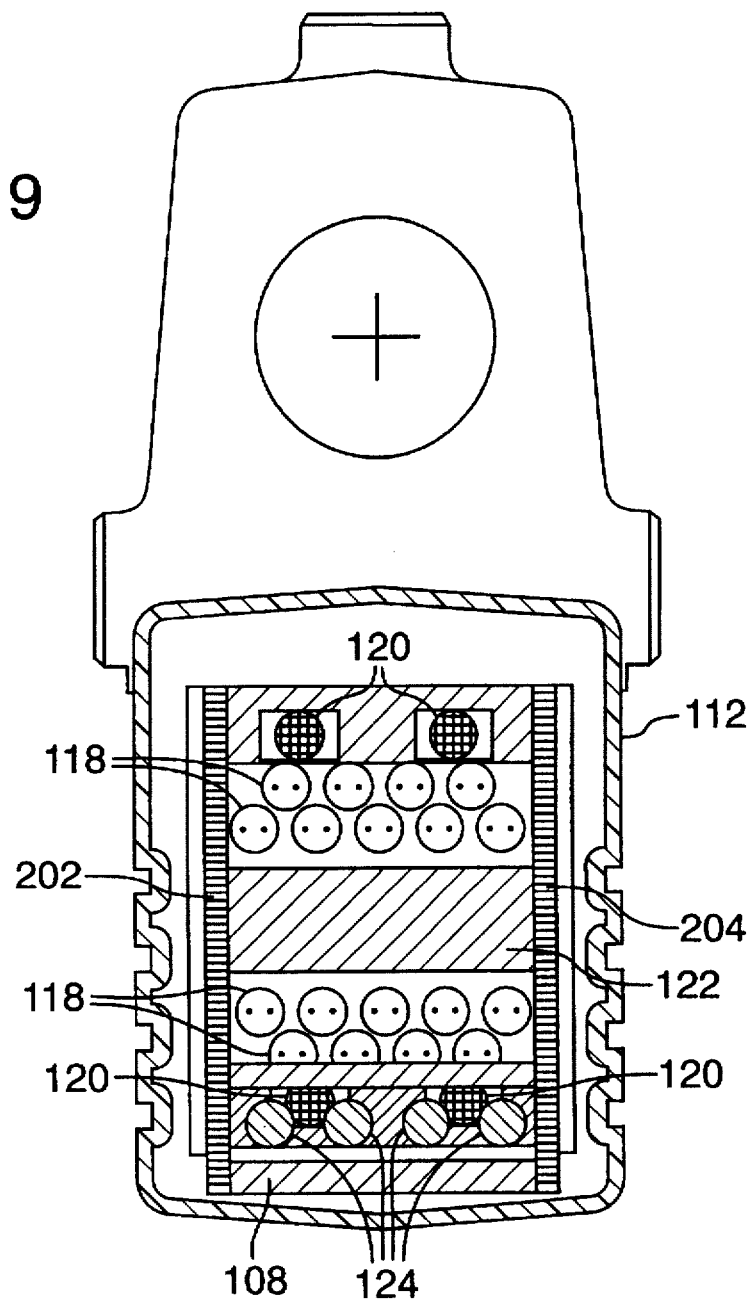
FIG. 9 is a sectional view of the illumination system of FIG. 8, taken along line 9—9.

Referring now to FIGS. 8 and 9 in conjunction, another embodiment of the optical character recognition system is illustrated. FIG. 9 is a partial cross-sectional view of the embodiment shown in FIG. 8 taken along line 9—9. The embodiment illustrated in FIGS. 8 and 9 includes a camera 102 with a 75-millimeter lens 104, an extension tube 103, a first light system 106, and a second light system 108 aligned parallel to a marked substrate 110. This embodiment includes LEDs for reading "soft" marks and broad spectrum incandescent lamps for reading "hard" marks. An enclosure 112 having a mounting bracket 114 for the camera 102 is provided for housing the light systems and a four channel light control unit 116 for controlling them. In addition, this embodiment includes a first and second plane or light source mirrors 202 and 204 to reflect light emitted from the light sources toward the camera field of view on the substrate 110, thereby allowing fewer LEDs and incandescent lamps to be used while achieving substantially equivalent illumination at the substrate in a much narrower package.

The first and second light source mirrors, 202 and 204 respectively, extend from a point outboard the light system 106, to a point proximate the baffles 132 and 134. Light emitted from the LED arrays is reflected by the first and second light source mirrors 202 and 204 respectively, toward the first mirror 126, which reflects the light to the substrate 110, thereby increasing the effective light intensity at the substrate. Similarly, the bright field lamps 120 emit light that is reflected by target 122 and then by the first and second light source mirrors 202 and 204 respectively, toward the first mirror 126, which reflects light to the substrate 110. As shown in the embodiment depicted in FIG. 9, the width of the enclosure 112 can be reduced significantly because fewer lamps and LEDs are needed. For example, whereas the embodiment illustrated in FIGS. 4–6 can have a width of about 3.6 inches, an embodiment using light source mirrors can have a housing that is 2.4 inches or less wide.

Figure 10:
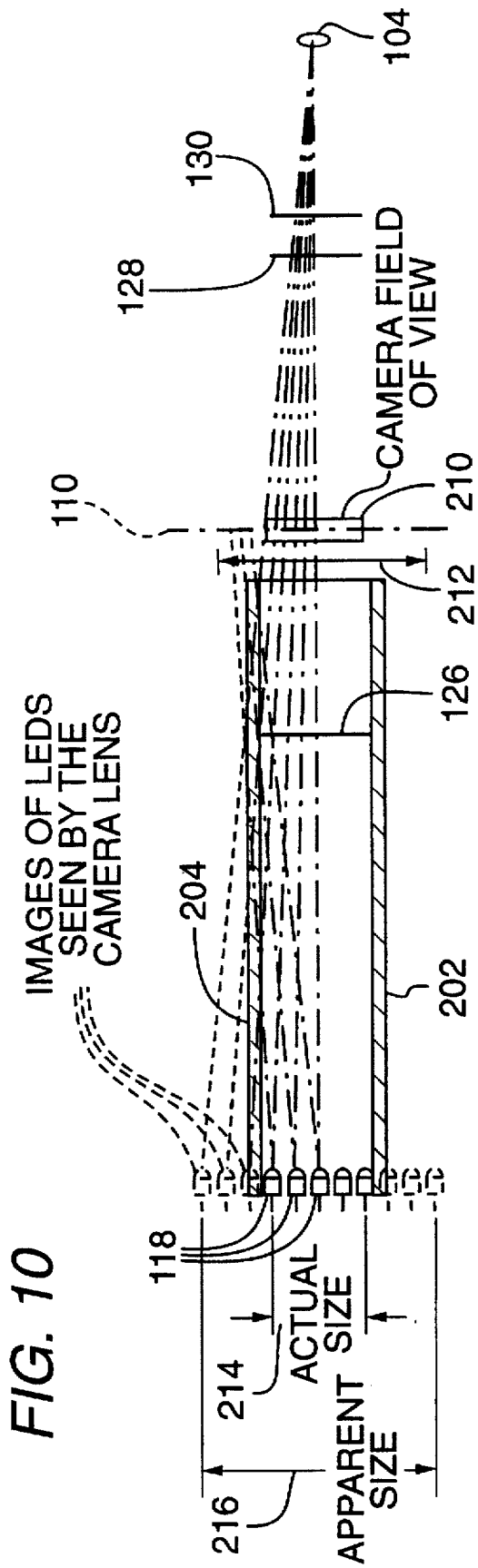
FIG. 10 is a sectional view of the unfolded optical path of the illumination system of FIG. 8.

Referring now to FIG. 10, a cross-sectional view of the unfolded optical path of the embodiment of FIG. 8 is shown. FIG. 10 is an exemplary depiction of emitted light from the innermost row of LEDs 118, being reflected by the second light source mirror 204 toward the substrate 110 and into the camera field of view. Although not shown, light is similarly reflected by the first light source mirror 202. Light from the LEDs 118, which would otherwise fall outside the camera field of view 210 that has a view width 212 that is a function of an actual size 214 of a width of LEDs 118, is reflected by the first and second light source mirrors 202 and 204 respectively, towards the first mirror 126 and then toward the camera field of view on the substrate 110, thus effectively increasing the width of LEDs 118 to a greater apparent size 216 to increase the effective illumination: Light reflected by the first and second light source mirrors 202 and 204 respectively, replaces light that would be emitted from LEDs in a wider LED array. It is readily appreciable to one skilled in the art that light from the outermost rows of LEDs 118 is reflected in an analogous manner. Similarly, light emitted from the target 122 and incandescent lamps 124 is reflected by the first and second light source mirrors 202 and 204 toward the camera field of view of the substrate 110.

Thus, the first and second light source mirrors 202 and 204 respectively, provide a dramatic reduction in the width of enclosure 112 and the number of required LEDs and lamps. In the embodiment shown in FIG. 9, the innermost rows of LEDs 118 include a row of five LEDs, the outermost rows of LEDs 118 include a row of four LEDs, and the two arrays of incandescent bulbs 120 each include two bulbs. The LEDs 118 require a width of about 1.5 inches. This is in contrast with the embodiment of FIG. 5 wherein the two outermost rows of nine LEDs 118 and the two innermost rows of eight LEDs 118 require a width of about 2.7 inches, and the enclosure is about 3.6 inches. Further, the two arrays of incandescent bulbs 120 each include three bulbs.

Many modifications of the presently disclosed invention will become apparent to those of skill in the art having benefitted from the instant disclosure without departing from the inventive concept. For example, mirrors may be placed at the top and bottom of the enclosure 112 to reflect light toward the first mirror 126. Further, many combinations and numbers of LEDs and lamps may be used without departing from the scope and spirit of the present invention.

What is claimed is:

1. An illumination system for illuminating indicia on the surface of a substrate, comprising:

a first light system of a first type for illuminating indicia of a first type on the surface of a substrate, the first light system defining a first optical path from the first light system to the substrate and having a source width that is normal to the first optical path, the source width having an actual size;

a second light system of a second type for illuminating indicia of a second type, the second light system defining a second optical path from the second light system to the substrate; and a first side mirror disposed along a portion of the first and second optical paths between the first light system and the substrate and between the second light system and the substrate, respectively, to direct a portion of the light from the first and second light systems toward the substrate, the side mirror creating an apparent size for the source width that is greater than the actual size.

2. The illumination system of claim 1, wherein the first side mirror extends from a point outboard the first and second light systems to a point proximate an optical member positioned along the first and second optical paths.

3. The illumination system of claim 1, further comprising a second side mirror opposing the first side mirror.

4. The illumination system of claim 3, wherein the first side mirror is planar.

5. The illumination system of claim 4, wherein the first side mirror is parallel to the second side mirror.

6. The illumination system of claim 5, wherein the first side mirror is spaced apart from the second side mirror by a distance of about 1.5 inches.

7. The illumination system of claim 3, further comprising a camera having a field of view that includes the substrate and has a view width that is a function of the apparent size of the source width.

8. The illumination system of claim 7, further comprising an enclosure that surrounds at least a portion of a third optical path defined by light emitted from either of the first or second light systems to the camera.

9. The illumination system of claim 8, wherein the enclosure includes a first wall to which the first side mirror is affixed and a second wall to which the second side mirror is affixed.

10. The illumination system of claim 1, wherein the first light system comprises an LED array or an incandescent bulb array.

11. The illumination system of claim 1, wherein the first light system comprises an LED array and the second light system comprises an array of incandescent bulbs.

12. The illumination system of claim 3, further comprising.

an enclosure that surrounds at least a portion of the first and second optical paths, the enclosure including a first wall to which the first side mirror is affixed and a second wall to which the second side mirror is affixed.

13. The illumination system of claim 11, wherein the indicia of the first type comprise "soft" marks and the indicia of the second type comprise "hard" marks.

14. The illumination system of claim 1, wherein the first light system comprises a first pair of arrays that respectively define an opposing symmetric pair of first optical paths, such that the first optical paths are disposed respectively to either side of an acute angle defined with respect to a normal to the substrate for illuminating the first type of indicia on the substrate.

15. The illumination system of claim 14, wherein the second light system comprises a second pair of arrays that respectively define an opposing symmetric pair of second optical paths, such that the second optical paths are disposed respectively to either side of an acute angle defined with respect to a normal to the substrate for illuminating the second type of indicia on the substrate.

16. The illumination system of claim 1, further comprising:

a camera having a field of view that is oriented with its longitudinal axis generally perpendicular to a normal to the substrate;

a second optical member confronting the substrate so as to deviate light incident thereto from the substrate toward a third optical member, and the third optical member confronting the second optical member so as to deviate light incident thereto from the second optical member toward the camera; and first and second baffles respectively disposed along the optical paths of the first and second light sources that occlude the respective light sources and thereby prevent them from being imaged onto the second and the third optical members while allowing the first and second types of indicia to be imaged by the second optical member and deviated therefrom to the third optical member and thence to the camera, allowing it to read the first and second types of indicia.

17. The illumination system of claim 7, wherein the camera has a field of view that is oriented with its longitudinal axis generally perpendicular to a normal to the substrate.

18. The illumination system of claim 7, wherein the camera has a field of view that is oriented with its longitudinal axis generally parallel to a normal to the substrate.

19. The illumination system of claim 3, wherein the first and second side mirrors are positioned respectively above and below the light systems.

20. The illumination system of claim 7, further comprising:

an optical member positioned along the first and second optical paths to deviate light incident to the optical member from the first and second light systems toward the substrate, such that the first side mirror is disposed along a portion of the first and second optical paths between the first light system and the optical member and between the second light system and the optical member, respectively, to direct a portion of the light from the first and second light systems toward the optical member and from the optical member toward the substrate.

21. The illumination system of claim 1, wherein the first side mirror extends from a point proximate said first and second light systems to a point proximate the substrate.

22. The illumination system of claim 1 in which the first and second indicia are overcoated with at least one layer.

23. An illumination system for illuminating indicia on the surface of a substrate, comprising:

a camera having a field of view that is oriented with its longitudinal axis generally perpendicular to a normal to the substrate;

first and second arrays of light sources defining optical paths, portions of which are respectively disposed to either side of an acute angle defined with respect to a normal to the substrate, for illuminating the indicia on the substrate;

a first optical member confronting the first and second arrays of light sources so as to deviate light incident thereto from the first and second arrays of light sources toward the substrate;

a second optical member, confronting the substrate so as to deviate light incident thereto from the substrate toward a third optical member, and the third optical member confronting the second optical member so as to deviate light incident thereto from the second optical member toward the camera;

first and second baffles respectively disposed along the optical paths of the first and second arrays of light sources that occlude the respective arrays and thereby prevent them from being imaged onto the second and the third optical members while allowing the indicia to be imaged by the second optical member and deviated therefrom to the third optical member and thence to the camera, allowing it to read the indicia; and first and second side mirrors extending from a point proximate said first and second arrays of light sources to a point proximate said substrate.

24. The illumination system of claim 23, wherein the first and second arrays are both LED arrays or both incandescent bulb arrays.

25. The illumination system of claim 23, wherein the first side mirror is spaced apart from the second side mirror by a distance of about 1.5 inches.

26. The illumination system of claim 24, wherein the first and second arrays are both LED arrays and the optical paths are first optical paths, further comprising:

third and fourth arrays of incandescent bulbs for illuminating indicia of a second type, the third and fourth arrays defining second optical paths having portions that are respectively disposed to either side of an acute angle defined with respect to a normal to the substrate, the second optical paths being different from the first optical paths, the optical member being positioned along the second optical paths to deviate light incident to the optical member from the third and fourth arrays sources toward the substrate, the first and second side mirrors being respectively disposed along a portion of the second optical paths between the third and fourth arrays and the optical member to direct a portion of the light from the third and fourth arrays toward the optical member and from the optical member toward the substrate.

27. The illumination system of claim 23, wherein the first array has a source width that is normal to the first optical path, the source width having an actual size; wherein the side mirror creates an apparent size for the source width that is greater than the actual size; and wherein the field of view has a view width that is a function of the apparent size of the source width.

* * * * *

UNITED STATES PATENT AND TRADEMARK OFFICE
CERTIFICATE OF CORRECTION

PATENT NO. : 5,737,122

DATED : April 7, 1998

INVENTOR(S) : DONALD R. WILT and RICHARD S. SIDELL

It is certified that error appears in the above-indentified patent and that said Letters Patent is hereby corrected as shown below:

Column 4, line 42, change "spacedapart" to --spaced apart--.

Column 5, line 53, change "arrays" to --array--.

Column 8, line 39, after "view" insert --210 that has a view width 212 that is function of an actual size 214 of a width of LEDs 118--.

Column 8, line 42, delete "210 that has a view width 212 that is function of an actual size 214 of a width of LEDs 118".

Column 8, line 45, change "towards" to --toward--.

Signed and Sealed this

Sixteenth Day of November, 1999

Attest:

Q. TODD DICKINSON

*Attesting Officer*     *Acting Commissioner of Patents and Trademarks*